(12) United States Patent
Demol et al.

(10) Patent No.: US 8,259,877 B2
(45) Date of Patent: Sep. 4, 2012

(54) METHOD AND DEVICE FOR AUTOMATIC GAIN CONTROL WITH LIMITED JITTER

(75) Inventors: Amaury Demol, Bourg la Reine (FR); Khaled Maalej, Paris (FR); Jonas Jönsson, Sundbyberg (SE)

(73) Assignee: Parrot, Paris (FR)

( * ) Notice: Subject to any disclaimer, the term of this patent is extended or adjusted under 35 U.S.C. 154(b) by 969 days.

(21) Appl. No.: 11/498,779

(22) Filed: Aug. 4, 2006

(65) Prior Publication Data
US 2007/0046375 A1 Mar. 1, 2007

(30) Foreign Application Priority Data

Aug. 4, 2005 (EP) ..................................... 05291671

(51) Int. Cl.
*H04L 27/08* (2006.01)

(52) U.S. Cl. ........ 375/345; 375/316; 330/129; 330/254; 455/234.1

(58) Field of Classification Search .................. 375/371, 375/226, 215; 713/502
See application file for complete search history.

(56) References Cited

U.S. PATENT DOCUMENTS

| | | | | |
|---|---|---|---|---|
| 3,711,783 A * | 1/1973 | Kelling | ........................... | 330/86 |
| 3,864,529 A * | 2/1975 | Tracey et al. | .................. | 375/293 |
| 3,944,942 A * | 3/1976 | Chudleigh, Jr. | ................. | 330/86 |
| 4,291,410 A * | 9/1981 | Caples et al. | .................. | 375/345 |
| 4,509,000 A * | 4/1985 | Ferguson | ....................... | 318/591 |
| 4,658,217 A * | 4/1987 | Takatori et al. | .................. | 327/98 |
| 4,680,588 A * | 7/1987 | Cantwell | ......................... | 342/92 |
| 4,710,772 A * | 12/1987 | Cantwell et al. | ................. | 342/92 |
| 5,025,456 A * | 6/1991 | Ota et al. | ....................... | 375/318 |
| 5,334,979 A * | 8/1994 | Hatakeyama | .................. | 341/138 |
| 5,497,405 A * | 3/1996 | Elliott et al. | ..................... | 375/372 |
| 5,923,706 A * | 7/1999 | Marz | ............................. | 375/226 |
| 5,929,706 A * | 7/1999 | Haruta et al. | .................. | 330/279 |
| 6,351,781 B1 * | 2/2002 | Gracias et al. | .................. | 710/22 |
| 6,784,707 B2 * | 8/2004 | Kim et al. | ...................... | 327/158 |
| 7,039,378 B2 * | 5/2006 | Yang et al. | ..................... | 455/232.1 |
| 7,054,604 B2 * | 5/2006 | Levy et al. | ..................... | 455/234.2 |
| 7,302,245 B2 * | 11/2007 | Yang et al. | ................. | 455/232.1 |
| 7,352,216 B2 * | 4/2008 | Hershbarger | ................. | 327/132 |
| 7,408,996 B2 * | 8/2008 | Hershbarger et al. | ......... | 375/258 |
| 2001/0052814 A1 * | 12/2001 | Takita | ............................. | 330/10 |
| 2001/0053680 A1 * | 12/2001 | Yamanaka et al. | ......... | 455/232.1 |
| 2002/0047744 A1 | 4/2002 | Ichihara | | |
| 2003/0026363 A1 * | 2/2003 | Stoter et al. | .................... | 375/345 |
| 2004/0171362 A1 * | 9/2004 | Levy et al. | ..................... | 455/144 |
| 2005/0070325 A1 | 3/2005 | Bellaouar et al. | | |
| 2005/0077960 A1 * | 4/2005 | Kim et al. | ...................... | 330/149 |
| 2007/0046375 A1 * | 3/2007 | Demol et al. | ................. | 330/278 |

* cited by examiner

*Primary Examiner* — David Ometz
*Assistant Examiner* — Santiago Garcia
(74) *Attorney, Agent, or Firm* — McKenna Long & Aldridge

(57) ABSTRACT

The invention concerns controlling automatic gain control for a digital signal receiver. The method includes receiving a digital feedback signal for controlling an amplifier and processing the digital feedback signal to deliver a driving signal to an analog amplifier. Processing the digital feedback signal comprises regulating the evolution of the driving signal so that it is maintained constant during a predetermined period of time after every change.

15 Claims, 2 Drawing Sheets

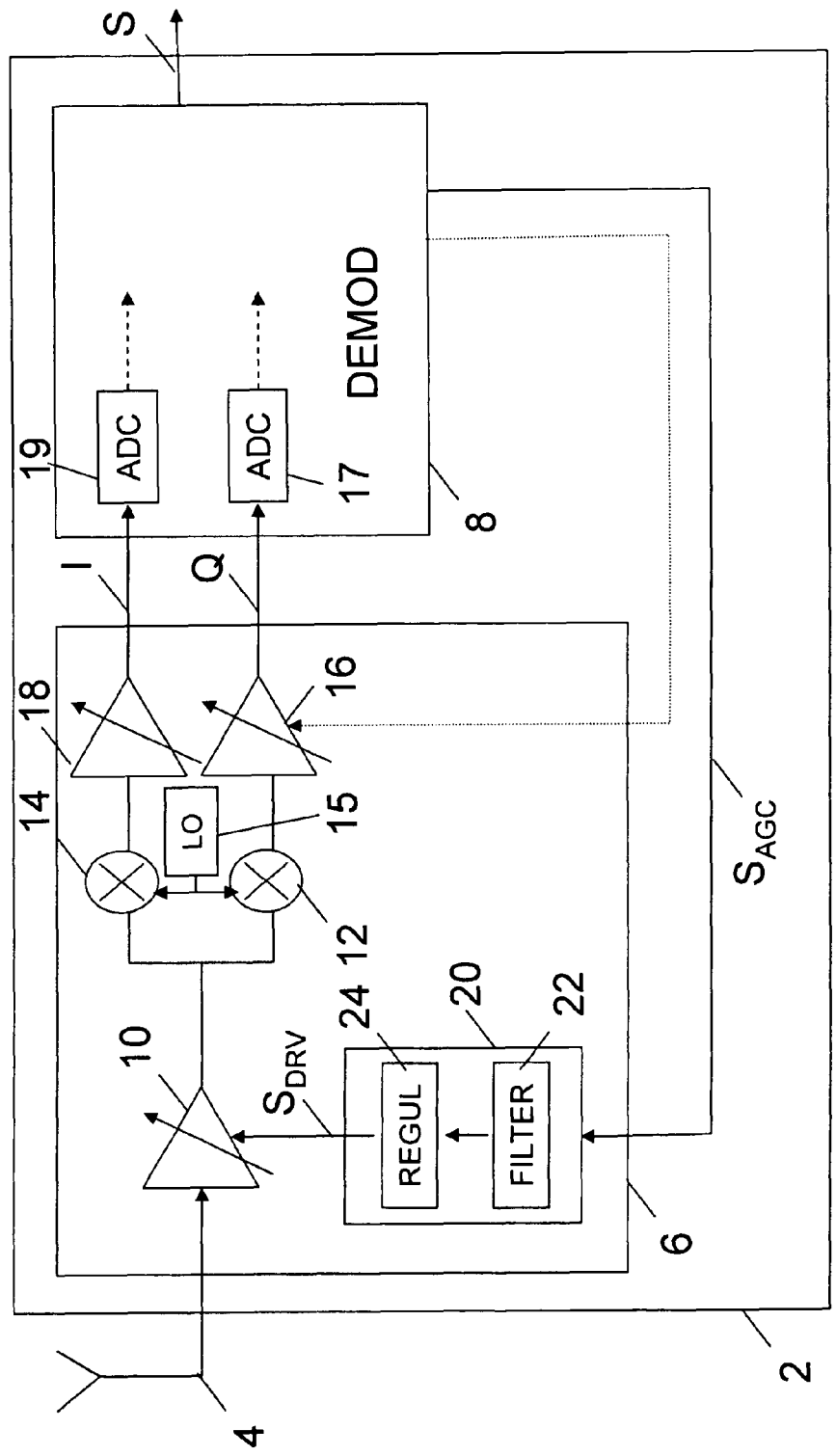

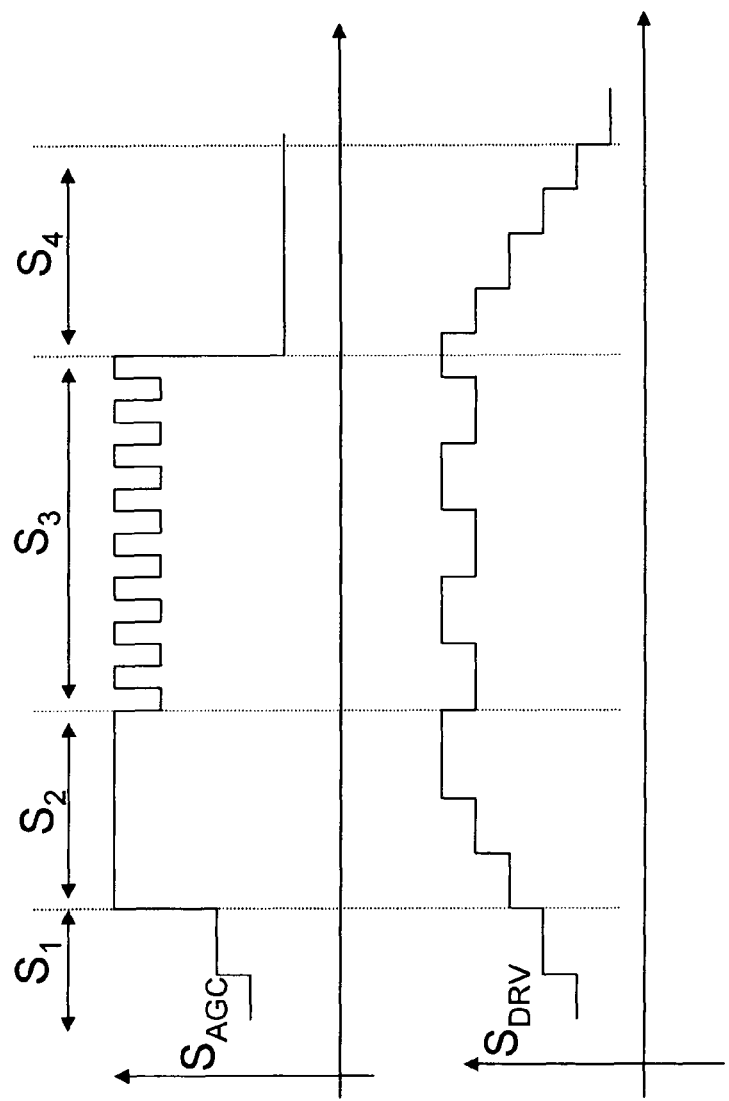
FIG 3A
FIG 3B
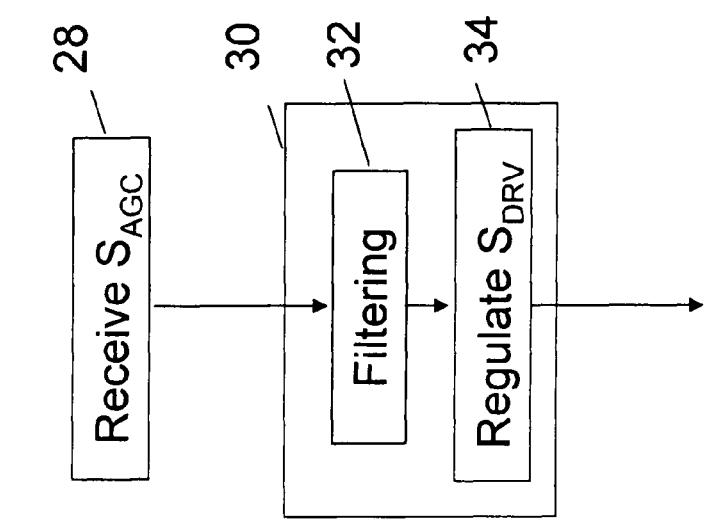
FIG 2

METHOD AND DEVICE FOR AUTOMATIC GAIN CONTROL WITH LIMITED JITTER

This application claims priority from European Patent Application No. 05291671.5 filed Aug. 4, 2005, which is hereby incorporated by reference in its entirety.

The present invention concerns automatic gain control (AGC) for digital signal receiver having analog amplifiers controlled by digital feedback signals.

Generally, AGC refers to circuits incorporated in a receiver and activated by the received signal which causes the gain of the receiver to vary substantially depending on the magnitude of the input so as to maintain the output level substantially constant.

Usually, the receiver comprises one or several analog amplifiers for the received signal. These analog amplifiers are automatically controlled by a digital feedback signal provided by downstream circuits, such as a digital demodulator for example.

For an analog amplifier with analog gain control input, the digital feedback signal is converted into an analog feedback signal for example by a digital to analog converter. For an analog amplifier with a digital gain control input, the digital feedback signal is directly provided.

As opposed to previously used analog feedback signals, a digital feedback signal varies in a discrete manner which may result in an amplitude or frequency jitter in the automatic gain control loop. This problem arises as soon as, at one stage, the feedback signal is digital.

For example, if the optimal setting for the amplification falls between two consecutives values of the digital feedback signal, the system will keep oscillating between these two values. Accordingly the digital feedback signal changes too frequently and induces noise at the frequency of the changes in the signal delivered by the amplifier. This kind of perturbations is referred to as frequency jitter.

Also, if the magnitude of the steps of the digital feedback signal is too important, it might influence the performance of the receiver by inducing perturbations such as saturation or preventing other loops to lock. This kind of perturbations is referred to as amplitude jitter.

Accordingly, automatic gain control using an analog amplifier with a digital feedback signal is subject to jitter in amplitude and/or frequency, thus decreasing the quality level of the output signal.

Some existing receivers comprise a low-pass filter which is applied to the digital feedback signal to deliver a corresponding driving signal. However, filtering consists in transmitting the electrical signal with a gain which varies in a determined way with the frequency of the electrical signal, thus even if the variations of the digital feedback signal are reduced they are transmitted to the analog amplifier, also resulting in amplitude and/or frequency jitter.

More precisely, these filters cannot limit the frequency jitter as they have a small time constant to avoid delay in the signal transmission. Furthermore, existing filters are not perfect and are not able to reject entirely signal pulses and thus can not avoid amplitude jitter.

An object of the present invention is to solve this problem by providing an efficient method and a corresponding device for automatic gain control that reduce jitter in amplitude and in frequency.

To this effect, the invention relates to a method for automatic gain control as recited in claim 1 and a corresponding device as recited in claim 3. The invention also relates to a processor program as recited in claim 8.

Thanks to the regulation of the driving signal of the analog amplifier, it is possible to control the height magnitude of the steps of the driving signal and the frequency at which the driving signal is modified in order to limit the jitter in amplitude and in frequency.

Other features and advantages of the invention will be apparent from the description illustrated by the drawings in which:

FIG. 1 is a block diagram of a receiver according to the invention;

FIG. 2 is a diagram of the method according to the invention;

FIG. 3A represents the digital feedback signal; and

FIG. 3B represents the driving signal as provided by the receiver of the invention.

In FIG. 1, a receiver 2 for radiofrequency (RF) signals and according to the present invention is represented.

This receiver 2 has an antenna 4 to receive RF signals like for example, analog or digital television signals. The receiver 2 comprises an analog front end 6 adapted to achieve automatic gain control and connected to a demodulator 8. In the example, the analog front end 6 is a zero-IF tuner, it receives in input the RF signal and delivers directly to the demodulator 8 two signals indicated as I and Q and corresponding to the complex and real components of the received signal. The digital demodulator 8 digitalizes these signals and applies the relevant demodulation or equalization processing to derive an information signal, called S, supplied to processing circuits with which the receiver 2 is associated. It also feeds a digital feedback signal, called $S_{AGC}$, back to the analog front end 6, thus forming an automatic gain control loop.

The analog front end 6 receives the RF input signal in an analog amplifier 10 also called RF amplifier.

The amplified RF signal is provided to two multipliers 12 and 14, which also receive two quadrature wave signals generated by a local oscillator 15. The multipliers 12, 14 have their outputs connected respectively to another set of analog amplifiers 16 and 18, whose outputs form the two components I and Q which are digitized by analog to digital converters (ADC) 17, 19 in the demodulator.

In the described example the amplifiers 16 and 18 are controlled by a classical feedback signal represented by a dotted line. This feedback signal is converted into an analog signal in the demodulator 8 and provided to the amplifiers.

The digital feedback signal $S_{AGC}$ provided by the demodulator 8 for controlling the amplifier 10 is received through a driving unit 20. Advantageously, this unit 20 comprises a filtering element 22 which performs conventional low-pass filtering.

Filtering consists in transmitting the electrical signal with a gain which varies in a determined way with the frequency of the electrical signal. Thus even if the variations of the digital feedback signal are reduced they are transmitted and appear at the output of the processing element 22.

The filter or filters of element 22 have relatively small time constants to avoid delay in the transmission of the digital feedback signal.

Then, the driving signal corresponding to the filtered digital signal is fed into a regulation element 24 adapted to deliver a regulated driving signal $S_{DRV}$ to the analog amplifier 10 to control the amplification applied to the received RF signal.

Regulation consists in controlling the evolution of the driving signal to avoid amplitude and frequency jitter. The element 24 maintains constant the driving signal after every change during a determined period of time to limit frequency jitter. Advantageously, the regulation element 24 also limits the amplitude variations of the driving signal to prevent amplitude jitter.

In the example, the driving signal $S_{DRV}$ is directly provided to the analog amplifier 10 which gain control input is adapted to receive digital driving signals.

With reference to FIGS. 2 and 3A, 3B, the processing of this receiver will be described, focussing on the automatic gain control.

In a classical manner, the signal is received by the antenna 4, then processed by the Zero-IF analog front end 6 to deliver the I and Q signals to the demodulator 8 which provides the analog front end 6 with the digital feedback signal $S_{AGC}$.

Accordingly, the method for controlling automatically the analog gain amplifier 10 for the RF signal comprises first a step 28 of receiving the digital feedback signal $S_{AGC}$. This digital feedback signal can be received by the gain control device from the demodulator 8, directly as a digital signal or as analog signal which is then converted back into a digital signal in driving unit 20.

Step 28 is followed by a step 30 of processing the digital feedback signal $S_{AGC}$ to deliver the driving signal $S_{DRV}$ to the analog amplifier 10.

In the embodiment described, this step 30 comprises first a substep 32 of filtering by the application of low-pass filters to the digital feedback signal $S_{AGC}$ by the processing element 32 to deliver the driving signal.

Step 30 then comprises a substep 34 of regulation of the evolution of the driving signal $S_{DRV}$, achieved by the regulation element 24.

As indicated previously, this regulation limits the amplitude evolution of the driving signal and imposes that the driving signal is maintained constant during a determinated period of time after every change. Advantageously, this period of time is less than 20 milliseconds (ms), preferentially less than 10 ms and more preferentially less than 5 ms.

In the described embodiment, the maximum high of each step is equal or less than 10 elementary steps, an elementary step being the minimum variation of the digital feedback signal and being dependant upon its number of bits. Preferentially, the maximum high of each step is equal or less than 5 elementary steps and more preferentially is equal to one elementary step.

This is shown for example in FIGS. 3A and 3B. FIG. 3A represents the digital feedback signal $S_{AGC}$ received by the driving unit 20 and FIG. 3B represents the driving signal $S_{DRV}$ delivered by the regulation element 24.

On a first segment indicated as $S_1$, the digital feedback signal $S_{AGC}$ evolves slowly by little incremental steps and the driving signal $S_{DRV}$ evolves in the same manner.

Then, on segment $S_2$, the digital feedback signal $S_{AGC}$ increases radically to a higher level which is then maintained. Such an important amplitude evolution creates conditions for amplitude jitter. Accordingly, the driving signal $S_{DRV}$ is regulated and this important increase of the digital feedback signal corresponds to several increasing steps of the driving signal, as represented on FIG. 3B. The high of each step corresponds to the maximum authorized amplitude evolution and the length of each level corresponds to the determined period of time during which the signal is maintained constant.

On each step occurring on this segment $S_2$, the regulated driving signal is set by the regulation unit and thus is independent of the digital feedback signal. Even if this last one varies during a step of this segment, the driving signal $S_{DRV}$ will remain unchanged.

Eventually if the digital feedback signal $S_{AGC}$ stays constant long enough, the driving signal $S_{DRV}$ will reach the same value.

On segment $S_3$, the digital feedback signal $S_{AGC}$ oscillates quickly between two values. Such an oscillation occurs for example when the aimed gain amplifier value falls between two values of the digital feedback signal. This oscillation is not reproduced by the driving signal $S_{DRV}$ as each value is maintained constant during a determinated period of time. In the example, it leads to a slow oscillation of the driving signal $S_{DRV}$ on segment $S_3$ as represented on FIG. 3B.

The determinated period of time upon which the driving signal must be maintained is set with respect to the receiver so that if the driving signal oscillates between two consecutive values as on segment $S_3$, this jitter in frequency does not affect the final demodulated signal.

Finally, as represented on segment $S_4$, the digital feedback signal $S_{AGC}$ decrease brutally to another value and accordingly, the driving signal $S_{DRV}$ aims to the same value through a succession of decreasing steps.

Of course, many other embodiments are possible.

In one embodiment, all the amplifiers of the analog front end, including the amplifiers at the output of the multipliers are provided with a regulated driving signal according to the invention.

In another example, it is also possible to use an analog amplifier which gain control input is adapted to receive an analog driving signal. In that case, a digital to analog converter must be introduced between the output of the regulation element and the gain control input of the analog amplifier. Advantageously, this converter is integrated in the regulation element which is adapted to achieve a digital processing and to directly deliver the analog driving signal.

Furthermore, it is possible to convert the digital feedback signal into an analog signal between the demodulator and the driving unit. To this effect, a digital to analog converter receives the signal outputted by the demodulator and delivers a corresponding analog signal to an analog to digital converters at the input of the driving unit. This permits to avoid the transmission of a digital signal with possible drastic variations nearby the analog front end in order to avoid signal perturbations.

Yet in another embodiment, the regulation is achieved by software in the demodulator which, in this case, delivers directly a regulated driving signal. In that case, the regulation element is included in the demodulator which is directly connected to the analog front end 6. Alternatively, the various embodiments can be combined and some amplifiers are provided with a regulated driving signal directly by the demodulator while some are provided with a regulated driving signal, processed by a regulation element outside the demodulator.

In another embodiment, the regulation unit is a specific component inserted between a classical demodulator and a classical analog front end in a receiver.

The method of the invention can also be achieved by a computer program for execution by a processor of an automatic gain control device, the computer program having instructions to perform the following processing when executed by said processor:
  receiving a digital feedback signal for an analog amplifier;
  providing a driving signal for said analog amplifier based upon said digital feedback signal; and
  regulating the evolution of the driving signal so that it is maintained constant during a determined period of time after every change.

Such a program can be adapted to achieve any of the embodiments described above and can be adapted in any kind of electronic articles such as digital television receiver, computers, laptops, and any other device and the internal components thereof.

The invention claimed is:

1. A method of automatic control of a level of gain of at least one analog amplifier (10) comprising:
  receiving (28) a digital feedback signal ($S_{AGC}$) for controlling the level of gain of the analog amplifier (10); and
  processing (30) the digital feedback signal to deliver a gain driving signal ($S_{DRV}$) to said analog amplifier (10),
  wherein processing comprises:
  regulating (34) an evolution of the gain driving signal ($S_{DRV}$) in a stepwise manner over time, by limiting each step change of the driving signal $S_{DRV}$ to a predetermined amplitude evolution; and
  maintaining each step change at a constant amplitude value for a predetermined amount of time before a next stepwise amplitude evolution, the predetermined amount of time being higher than the amount of time at which the amplitude of the digital feedback signal received is maintained constant, said gain driving signal ($S_{DRV}$) evolving in the same manner as the digital feedback signal ($S_{AGC}$).

2. The method according to claim 1, wherein regulating (34) comprises setting a maximum value of the predetermined amplitude evolution of the gain driving signal ($S_{DRV}$).

3. The method according to claim 1, wherein processing (30) the digital feedback signal ($S_{AGC}$) comprises low-pass filtering the digital feedback signal ($S_{AGC}$) before regulating (34).

4. An automatic gain control device (30) for at least one analog amplifier (10), said device (30) comprising receiving means for a digital feedback signal ($S_{AGC}$) for controlling the gain of the at least one analog amplifier (10) and processing means adapted to regulate the digital feedback signal ($S_{AGC}$) to deliver a gain driving signal ($S_{DRV}$) to the at least one analog amplifier (10), wherein the processing means comprise a regulation unit (24) to regulate an evolution of the gain driving signal ($S_{DRV}$) in a stepwise manner over time, by limiting each step change to a predetermined amplitude evolution and maintaining each step change at a constant amplitude value for a predetermined amount of time before a next stepwise amplitude evolution, the predetermined amount of time being higher than the amount of time at which the amplitude of the digital feedback signal received is maintained constant, said gain driving signal ($S_{DRV}$) evolving in the same manner as the digital feedback signal ($S_{AGC}$).

5. The automatic gain control device according to claim 4, wherein said regulation unit (24) is adapted to set a maximum value of the predetermined amplitude evolution of the gain driving signal ($S_{DRV}$).

6. The automatic gain control device according to claim 4, further comprising a processing unit (22) adapted to apply low-pass filters, receiving in input said digital feedback signal ($S_{AGC}$) and providing its output to said regulation unit (26).

7. A receiver for radiofrequency signals comprising an analog front end (6) with at least one analog amplifier (10) connected to a demodulator (8), said demodulator (8) providing the analog front end (6) with a digital feedback signal ($S_{AGC}$) for controlling the analog amplifier, and an automatic gain control device (30) according to claim 5 receiving said digital feedback signal ($S_{AGC}$) and providing a gain driving signal ($S_{DRV}$) to the analog amplifier (10).

8. The receiver according to claim 7, further comprising a digital to analog converter at an output of the demodulator (8) to convert the digital feedback signal into a corresponding analog signal and an analog to digital converter at an input of the automatic gain control device (30) to receive said corresponding analog signal and convert it back into the digital feedback signal.

9. A program for execution in a non-transitory computer readable medium by a processor of a radiofrequency receiver comprising instructions to perform the following processing, when executed by said processor:
  receiving, at the radiofrequency receiver, a digital feedback signal ($S_{AGC}$) for controlling a level of gain of at least one analog amplifier (10); and
  processing the digital feedback signal to deliver a gain driving signal ($S_{DRV}$) to said analog amplifier (10),
  wherein processing comprises:
  regulating an evolution of the digital feedback signal ($S_{AGC}$) as the digital feedback signal evolves in a stepwise manner over time, by limiting each step change of the gain driving signal ($S_{DRV}$) to a predetermined amplitude evolution, the predetermined amplitude evolution being less than the amplitude evolution of the received digital feedback signal; and
  maintaining each step change at a constant amplitude value for a predetermined amount of time before a next stepwise amplitude evolution, the predetermined amount of time being higher than the amount of time at which the amplitude of the digital feedback signal received is maintained constant, said gain driving signal ($S_{DRV}$) evolving in the same manner as the digital feedback signal ($S_{AGC}$).

10. The method of claim 1, wherein the predetermined amplitude evolution is less than the amplitude evolution of the received digital feedback signal.

11. The method of claim 1, wherein the predetermined amount of time is shorter than the amount of time at which the amplitude of the digital feedback signal received is maintained constant.

12. The automatic gain control device of claim 4, wherein the predetermined amplitude evolution is less than the amplitude evolution of the received digital feedback signal.

13. The program for execution in a non-transitory computer readable medium by a processor of claim 9, wherein the predetermined amplitude evolution is less than the amplitude evolution of the received digital feedback signal.

14. The program for execution in a non-transitory computer readable medium by a processor of claim 9, wherein the predetermined amount of time is shorter than the amount of time at which the amplitude of the digital feedback signal received is maintained constant.

15. A method of automatic control of a level of gain of at least one analog amplifier comprising:
  receiving (28) a digital feedback signal ($S_{AGC}$) for controlling the level of gain of the amplifier (10); and
  processing (30) the digital feedback signal to deliver a gain driving signal ($S_{DRV}$) to said analog amplifier (10);
  wherein processing comprises setting a predefined amplitude evolution and a predetermined amount of time, and
  if the amplitude evolution of the digital feedback signal is higher than the predefined amplitude evolution:
    regulating (34) an evolution of the digital feedback signal ($S_{AGC}$) in a stepwise manner over time, by limiting each step change to a predetermined amplitude evolution, the predetermined amplitude evolution being lower than the amplitude evolution of the digital feedback signal received; and
  if the evolution of the digital feedback signal is shorter than the predetermined amount of time:
    maintaining each step change at a constant amplitude value for a predetermined amount of time before a next stepwise amplitude evolution, the predetermined amount of time being higher than the amount of time at which the amplitude of the digital feedback signal received is maintained constant; then said gain driving signal ($S_{DRV}$) evolving in the same manner as the digital feedback signal ($S_{AGC}$).

* * * * *